United States Patent [19]
Farquhar et al.

[11] Patent Number: 5,397,857
[45] Date of Patent: Mar. 14, 1995

[54] PCMCIA STANDARD MEMORY CARD FRAME

[75] Inventors: Jim Farquhar, Coronado; Charlie Centofante, Hollister; Ken Dorf, San Jose; Brandt Weibezahn, Pleasanton; Iggoni Fajardo, San Jose, all of Calif.

[73] Assignee: Dual Systems, San Jose, Calif.

[21] Appl. No.: 92,012

[22] Filed: Jul. 15, 1993

[51] Int. Cl.⁶ .......................... H05K 5/03; H05K 7/00
[52] U.S. Cl. .................................. 174/52.1; 361/753; 361/575
[58] Field of Search ............. 361/684, 737, 748, 753, 361/752, 757; 174/52.4, 52.5, 52.1; 428/76, 192, 542.8; 156/73.1; 264/248, 272.17

[56] References Cited
U.S. PATENT DOCUMENTS

| | | | |
|---|---|---|---|
| 3,579,817 | 5/1971 | Boyle | 174/52.4 |
| 3,901,731 | 8/1975 | Warszawaski et al. | 429/9 |
| 4,164,068 | 8/1979 | Shropshire et al. | 156/73.1 |
| 4,305,897 | 12/1981 | Hazama et al. | 264/248 |
| 5,107,073 | 4/1992 | Steffen | 174/52.1 |
| 5,208,732 | 5/1993 | Baudouin et al. | 361/684 |
| 5,242,310 | 9/1993 | Leung | 361/737 |

OTHER PUBLICATIONS

Branson Technical Brochure, PW-4, Ultrasonic Insertion, Nov. 1981.
Branson Technical Brochure, PW-3, Joint Design For Ultrasonic Welding, Aug. 1980.

*Primary Examiner*—Michael W. Ball
*Assistant Examiner*—Richard Crispino
*Attorney, Agent, or Firm*—Keith Kline

[57] ABSTRACT

A container for a memory card and the process by which the container is manufactured. The container comprises chiefly two stamped steel covers, (an upper and a lower cover half), each secured to a plastic frame element. The cover halves are secured by extended fingers which wrap around the plastic frame. This provides a double layer of metal at the perimeter of the frame. The two cover halves are situated so as to encapsulate the subject PCB and to affix it in its proper position. The two cover halves are then welded together using sonic welding on the plastic frame. The frame has been designed to meet all PCMCIA standards, including polarizing keys and grounding points.

6 Claims, 4 Drawing Sheets

PCMCIA STANDARD MEMORY CARD FRAME

FIELD OF THE INVENTION

The present invention relates generally to memory media and I/O device containers, and more particularly to a packaging container for printed circuit boards that conforms to standards set by PCMCIA, JEDIC, ISO, etc. for peripheral devices.

BACKGROUND OF THE INVENTION

Current technology computing devices are so small that there is very little room for storage devices such as a hard disk drive or I/O device. In order to expand a portable, laptop, or any other type of computer's capacity and functioning capability, manufacturers have devised "plug-in" peripheral cards in the form of printed circuit boards (PCB's) contained within an exterior package. These devices are termed "PCMCIA style peripheral devices".

The PCMCIA style devices can be used to perform the functions of software, resident memory in hardware devices, or in the place of a hard drive. The cards can be used as flash memory, to facilitate LAN networking, paging devices, and as FAX modems. They may be used in cellular telephones, PROMS, EPROMS, EE-PROMS, RAMS, SRAMS, and DRAMS. In short, the cards are very versatile as well as inexpensive.

Due to the myriad methods possible to construct the interface of the memory card with the computer, the Personal Computer Memory Card International Association (PCMCIA) and comparable organizations have established certain standards for the construction of the memory cards within their containers.

Use constraints require that a PCB be sealed within a rigid package for insertion into the PC. One problem in the current art methods of fixing the card in metallic containers is that adhesives, solvents and/or epoxies are generally used to secure the two halves of the container. Since the bonding requires the adhesion of two dissimilar metals, current art processes can lead to functional problems with the card, as well as to failures of the bond.

Another disadvantage is that current art constructions use many components, leading to greater manufacturing cost, and a higher likelihood of failures.

OBJECTS, SUMMARY, AND ADVANTAGES OF THE INVENTION

Accordingly, it is an object of the present invention to provide a PCMCIA style peripheral device container that meets PCMCIA, JEDIC, and ISO standards. It is a further object of the present invention to provide a container that comprises few components to reduce manufacturing cost.

The present invention is a container for a peripheral device and the process by which the container is manufactured. The container comprises chiefly two stamped metal covers, (an upper and a lower cover half), each secured to a plastic frame element. The cover halves are secured by extended fingers which wrap around the plastic frame. This provides a double layer of metal at the perimeter of the frame.

The two cover halves are situated so as to encapsulate the subject PCB and to affix it in its proper position. The two cover halves are then welded together using sonic welding on the plastic frame or resistance welding on the covers. The frame has been designed to meet all PCMCIA standards, including but not limited to polarizing keys and grounding points.

Advantages of the present invention are as follows:
1. Joinder of the two package halves is accomplished without the use of adhesives. This leads to greater reliability of the memory card.
2. Very few components are used, minimizing manufacturing costs.
3. More space for the PCB is available within a given package volume.
4. The present invention provides a memory card container that is stronger than prior art containers.
5. The device constructed according to the present invention lends itself to automated assembly.
6. The device of the present invention is very versatile, and can be used for types I, II, III, and IV boards. It is envisioned that future board designs will also be compatible with the present invention.
7. The process will allow a card manufacturer to bond only similar materials, plastic to plastic, since the bonding of the dissimilar materials, plastic to metal, is accomplished by the package manufacturer.
8. Application of a non-conductive layer to the two cover halves prior to stamping allows the package to have a non-conductive interior.
9. The design allows the PCB to be fixed in place by opposing plastic elements ("bosses") at any level within the package.
10. The PCB connectors and/or other I/O devices can be clamped between the cover halves.
11. Overall package thickness can be controlled to a very strict tolerance.
12. The package provides variable grounding locations along the length of the package sides.

These and other objects and advantages of the present invention will become apparent to those skilled in the art in view of the description of the best presently known mode of carrying out the invention as described herein and as illustrated in the drawings.

BEST MODE OF CARRYING OUT THE INVENTION

Figure 1:
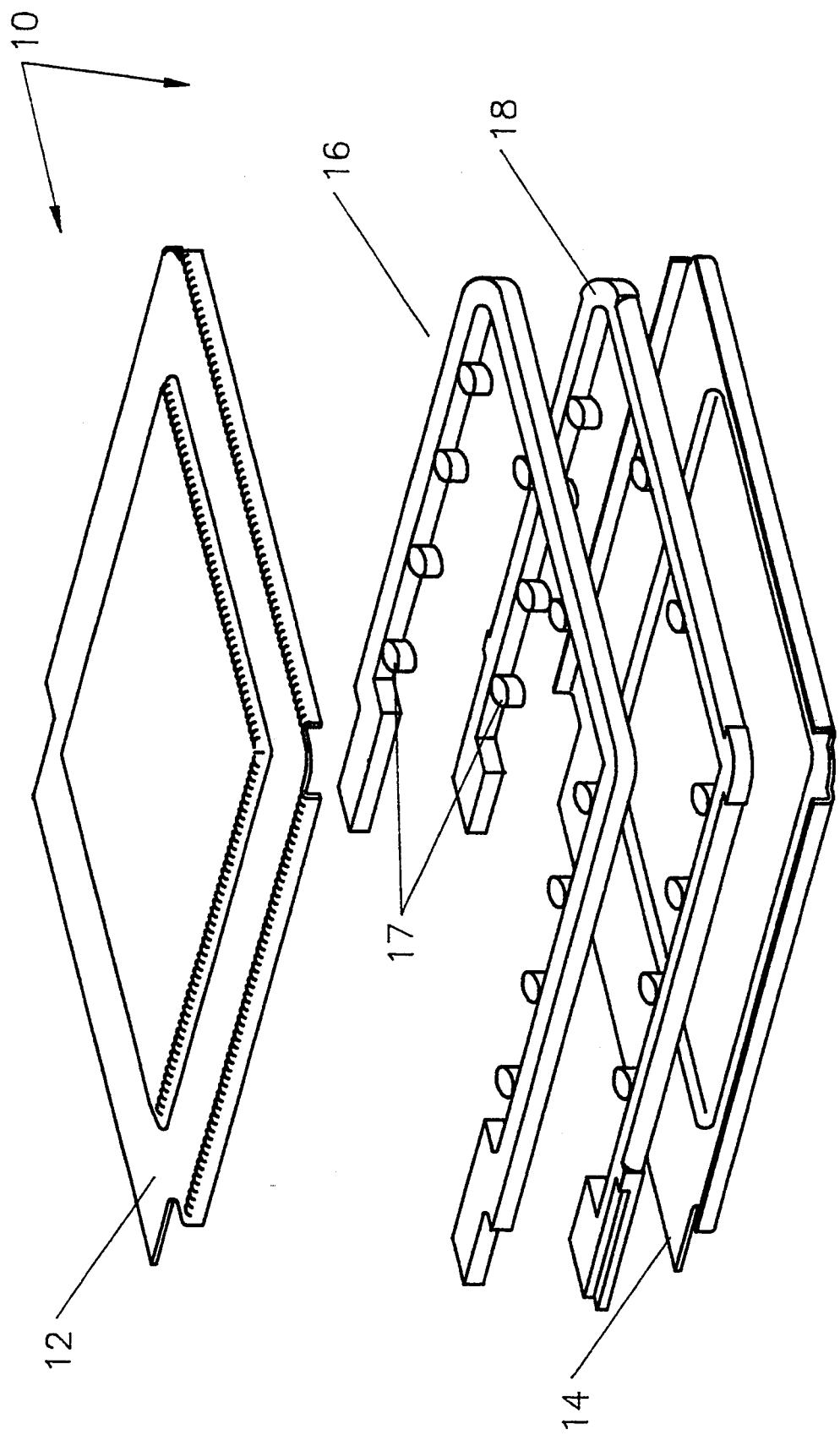
FIG. 1 is a perspective exploded view of the metal covers and plastic frame of the package of the present invention.

The present invention is a PCMCIA style peripheral device package 10. Referring to FIG. 1, it can be seen that the package 10 comprises chiefly an upper cover 12, a lower cover 14, an upper frame element 16, and a lower frame element 18. The covers 12 & 14 are formed from stamped metal, and the frame elements 16 & 18 are molded plastic.

While the material for the covers is chosen to be stamped metal, there is no requirement that it be so. Any rigid material will suffice. However, if the cover is of a conductive material, it will serve to reduce EMI, RF and ESD problems, these being factors which electronic devices seek to minimize. It should be further noted that conductive material cannot be eliminated completely as PCMCIA requires a grounding point. The covers 12 & 14 will generally be mirror images of each other, but may not be in certain applications.

An optional addition to the present invention is to coat the interior of the covers 12 & 14 with a thin layer of a non-conductive material. This allows the finished product to have a conductive exterior with a non-conductive interior, thus isolating the conductivity of the interior of the package.

Figure 2:
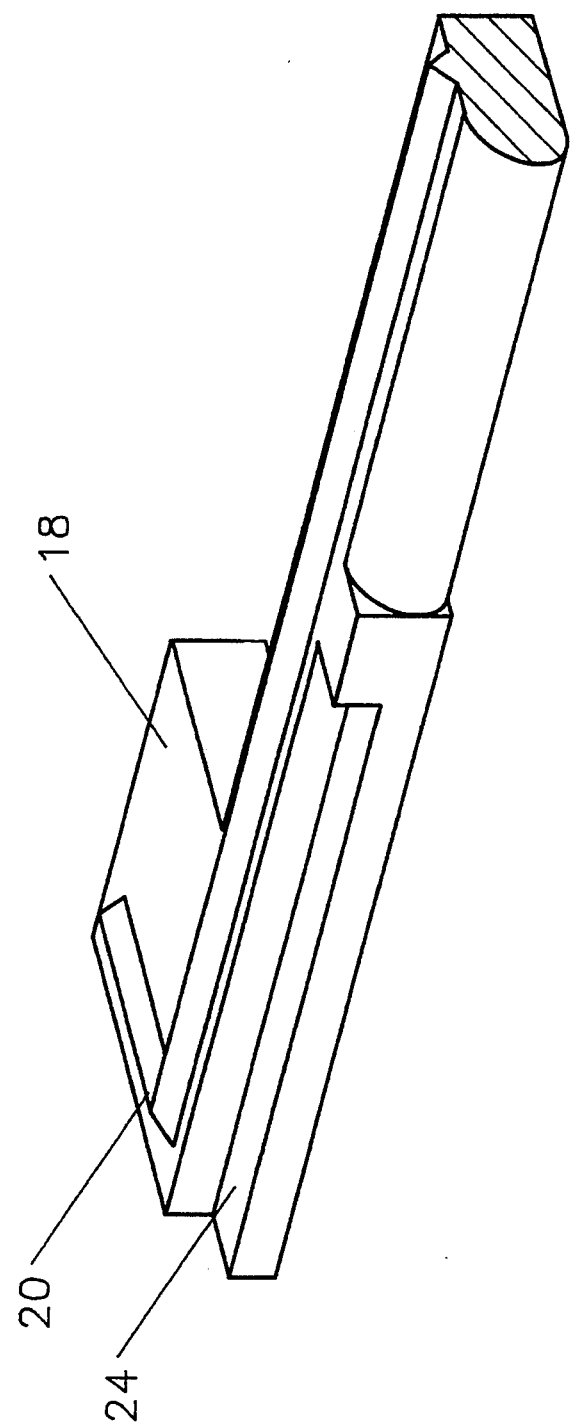
FIG. 2 is a detail view of the plastic frame showing the energy director utilized in the sonic welding process.
Figure 3:
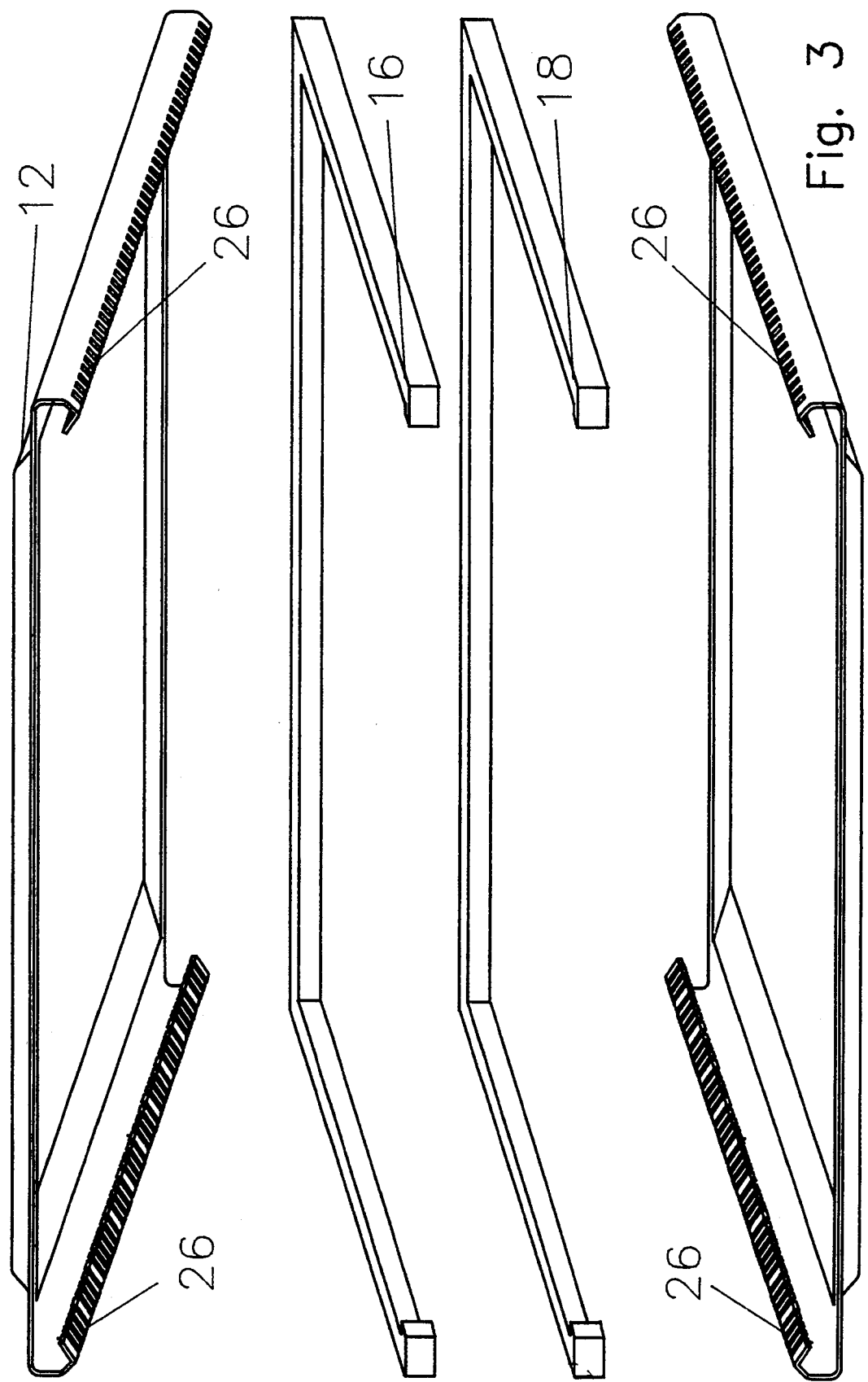
FIG. 3 is an exploded front end view of the metal package covers and plastic frame.
Figure 4:
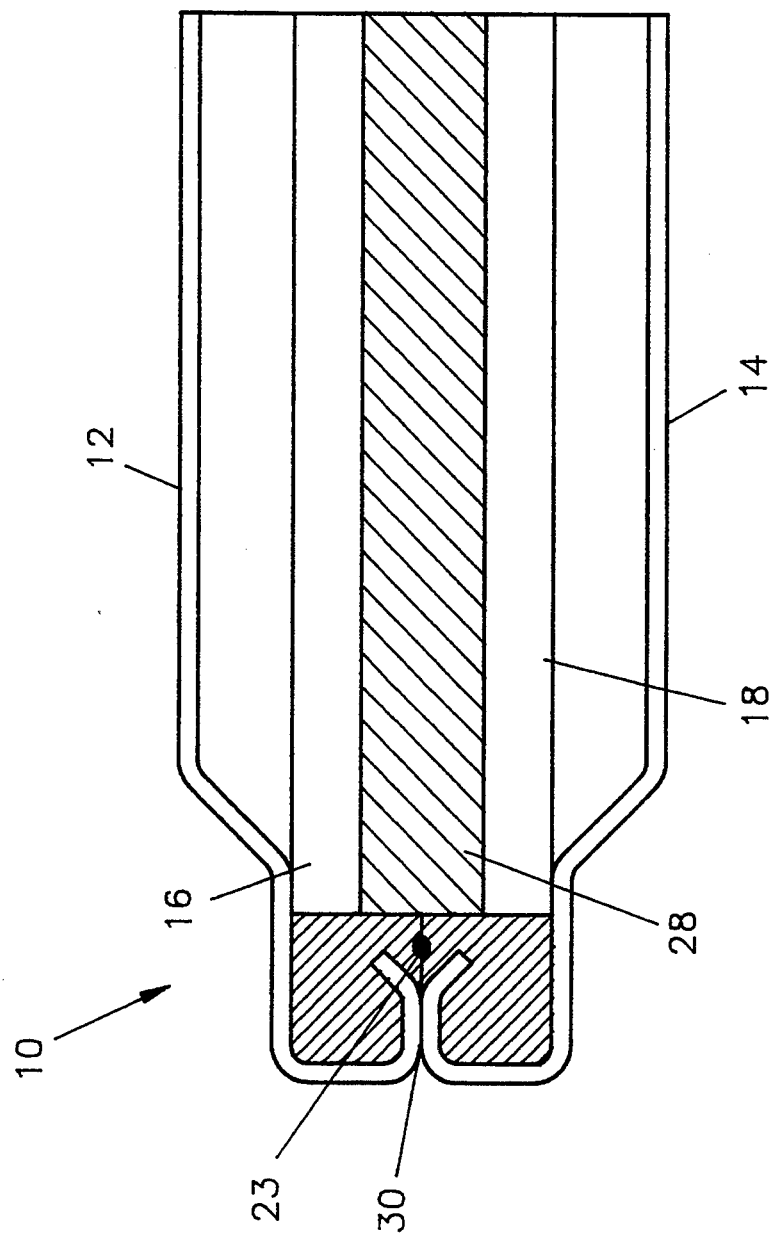
FIG. 4 is side cross-sectional view of a memory card and container as embodied by the present invention.

Referring now to FIGS. 2 & 3, a lower energy director 20 extends above one-half of the perimeter upper surface of the lower frame element 18. A corresponding energy director element 22 extends along one-half of the lower perimeter surface of the upper frame element 16. These energy directors 20 & 22 mate with the corresponding frame surface to form the weld during the sonic welding process.

A polarizing key 24 is located at a corner of the lower frame element 18. The polarizing key 24 defines how the PCMCIA style peripheral device mates with the device in which it is being used. The polarizing key is defined for a given use by PCMCIA.

In order to facilitate bonding, the edges of the covers 12 & 14 are bent to conform to the shape of the frame elements 16 & 18. In addition, metal fingers 26 are provided on each side of the covers 12 & 14. The metal fingers 26 become embedded in the plastic frame elements 16 & 18 during the bonding and/or molding process to form an integral frame cover element. This ensures that the two halves of the package can be securely affixed to each other. The covers 12 & 14 being wrapped around the frame elements 16 & 18 also serves to strengthen the package due to the fact that a double layer of metal is formed at the perimeter of the package.

The manufacture of the PCMCIA style peripheral device with its package is accomplished as follows: first, the upper and lower covers 12 & 14 are stamped. The covers 12 & 14 are then mated with the frame elements 16 & 18. This is accomplished by injection molding. The covers 12 & 14 are placed into a mold, where they are "self-secured" in position. The self-securing is accomplished by the geometry and dimensions of the covers 12 & 14. The covers 12 & 14 are stamped to be slightly wider than the mold. Thus the covers are slightly sprung when they are placed into the mold, and remain in the proper position for the injection process. Certainly there is no requirement that the covers be self-secured in the mold. Any means of securing will suffice.

The plastic frame elements 16 & 18 are then shot into the mold. As the plastic frames are molded, the metal fingers 26 on the covers 12 & 14 become embedded in the frame elements 16 & 18 so that separation of the covers 12 & 14 from the frame elements 16 & 18 cannot take place. The end result of the molding process is that the covers 12 & 14 have a metal surface exposed at their sides to create a grounding point when bonded together. Further toward the interior of the unit, the plastic energy directors 20 & 22 are also exposed to facilitate bonding.

One aspect of using an injection molding process is that injection molding requires that ejector pins 17 be provided on the frame elements 16 & 18. In the present invention, the ejector pins 17 are also used to position a PCB 28 that is to be packaged in the package 10. The pins 17 provide a supporting surface for the PCB 28 which can be adjusted to any height desired for a particular application. Thus an element necessary for the injection process becomes a key for the positioning of the board in the package. Positioning of the PCB is therefore accomplished easily and at minimal additional cost.

The energy directors 20 & 22 are then sonic welded to the opposing plastic frame element so that the upper frame element 16 is permanently bonded to the lower frame element 18, both of which encase the PCB 28.

Thus the covers are secured to the frame elements, which in turn are welded to each other. This ensures that the memory card package will be very reliable and durable, and that the package height is controlled.

It should be noted that it is envisioned that the bonding process between the cover elements may also be performed by resistance welding.

A further option is to inject a foam into the interior of the package which would crystallize and act as an insulator or a heat sink.

It should also be noted that in practice, a card manufacturer will receive the two cover halves ready for welding, and will be the supplier of the board. Because the package has a modular design, it will accommodate many different connectors. Further, because the package manufacturer has accomplished a secure bonding of dissimilar materials, the metal covers bonded to the plastic frame, the bonding required by the card manufacturer is a simple process involving only bonding of like materials, i.e. plastic to plastic sonic welding.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

We claim:

1. A peripheral device PCB package comprising: two stamped metal covers with a plastic frame element corresponding to each cover; each cover having a first side and a second side with a plurality of fingers extending from said sides and wherein edges of the metal covers are bent to conform to the shape of the frame and said fingers are embedded in the plastic frame elements forming an integral unit, the plastic frame elements being injected molded around the fingers;

and wherein the plastic frame element extends beyond the plane of the metal cover so that a plastic perimeter surface is exposed, thereby facilitating bonding of the two covers.

2. The package as claimed in claim 1 wherein: ejector pins on the plastic frames are provided to position a PCB.

3. The package as claimed in claim 1 wherein: the plastic frame elements include a polarizing key.

4. The package as claimed in claim 1 wherein: the plastic frame elements include energy directors.

5. The package as claimed in claim 1 wherein: a grounding point is established by metal-to-metal contact of the covers.

6. The package as claimed in claim 1 wherein: the interiors of the covers are coated with a thin layer of non-conductive material.

* * * * *

UNITED STATES PATENT AND TRADEMARK OFFICE
CERTIFICATE OF CORRECTION

| | |
|---|---|
| PATENT NO. | : 5,397,857 |
| APPLICATION NO. | : 08/092012 |
| DATED | : March 14, 1995 |
| INVENTOR(S) | : Jim Farquhar et al. |

It is certified that error appears in the above-identified patent and that said Letters Patent is hereby corrected as shown below:

Column 4, line 50, change "the" (first instance) to --a--.

Signed and Sealed this

Fifth Day of June, 2007

JON W. DUDAS
*Director of the United States Patent and Trademark Office*